United States Patent
Chen et al.

(10) Patent No.: US 9,698,180 B2
(45) Date of Patent: Jul. 4, 2017

(54) METHOD OF FABRICATING OPTICAL SENSOR DEVICE AND THIN FILM TRANSISTOR DEVICE

(71) Applicant: AU Optronics Corp., Hsin-Chu (TW)

(72) Inventors: Shin-Shueh Chen, Hsin-Chu (TW); Pei-Ming Chen, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/084,458

(22) Filed: Mar. 29, 2016

(65) Prior Publication Data

US 2017/0069667 A1    Mar. 9, 2017

(30) Foreign Application Priority Data

Sep. 9, 2015    (TW) .............................. 104129730 A

(51) Int. Cl.
| | |
|---|---|
| *H01L 21/00* | (2006.01) |
| *H01L 27/144* | (2006.01) |
| *H01L 29/423* | (2006.01) |
| *H01L 29/417* | (2006.01) |
| *H01L 29/66* | (2006.01) |

(Continued)

(52) U.S. Cl.
CPC .... *H01L 27/1443* (2013.01); *H01L 29/41733* (2013.01); *H01L 29/42356* (2013.01); *H01L 29/66765* (2013.01); *H01L 29/66969* (2013.01); *H01L 31/02005* (2013.01); *H01L 31/1804* (2013.01); *H01L 31/1864* (2013.01); *H01L 31/1884* (2013.01)

(58) Field of Classification Search
CPC ............. H01L 27/3269; H01L 27/3248; H01L 27/1443
See application file for complete search history.

(56) References Cited

U.S. PATENT DOCUMENTS 5,424,230 A  * 6/1995  Wakai ................. H01L 21/2022
                                                  148/DIG. 1
8,946,732 B2     2/2015  Fan
(Continued)

*Primary Examiner* — Selim Ahmed
*Assistant Examiner* — Evan Clinton
(74) *Attorney, Agent, or Firm* — Locke Lord LLP; Tim Tingkang Xia, Esq.

(57) ABSTRACT

An integration method of fabricating optical sensor device and thin film transistor device includes the follow steps. A substrate is provided, and a gate electrode and a bottom electrode are formed on the substrate. A first insulating layer is formed on the gate electrode and the bottom electrode, and the first insulating layer at least partially exposes the bottom electrode. An optical sensing pattern is formed on the bottom electrode. A patterned transparent semiconductor layer is formed on the first insulating layer, wherein the patterned transparent semiconductor layer includes a first transparent semiconductor pattern covering the gate electrode, and a second transparent semiconductor pattern covering the optical sensing pattern. A source electrode and a drain electrode are formed on the first transparent semiconductor pattern. A modification process including introducing at least one gas is performed on the second transparent semiconductor pattern to transfer the second transparent semiconductor pattern into a conductive transparent top electrode.

26 Claims, 20 Drawing Sheets

(51) Int. Cl.
*H01L 31/18* (2006.01)
*H01L 31/02* (2006.01)

(56) References Cited

U.S. PATENT DOCUMENTS

| | | | |
|---|---|---|---|
| 2004/0200976 A1* | 10/2004 | Yagi | G01J 1/429 |
| | | | 250/372 |
| 2006/0001120 A1* | 1/2006 | Wright | H01L 27/1463 |
| | | | 257/452 |
| 2007/0161165 A1* | 7/2007 | Liu | H01L 29/66757 |
| | | | 438/151 |
| 2009/0280606 A1 | 11/2009 | Shih | |
| 2011/0012091 A1* | 1/2011 | Forrest | B82Y 10/00 |
| | | | 257/40 |
| 2011/0037729 A1* | 2/2011 | Cho | G06F 3/0412 |
| | | | 345/175 |
| 2012/0205646 A1 | 8/2012 | Cho | |
| 2016/0049431 A1* | 2/2016 | Taghibakhsh | G01T 1/2006 |
| | | | 250/370.08 |

\* cited by examiner

METHOD OF FABRICATING OPTICAL SENSOR DEVICE AND THIN FILM TRANSISTOR DEVICE

BACKGROUND OF THE INVENTION

1. Field of the Invention

The present invention relates to a method of fabricating an optical sensor device and a thin film transistor device, and more particularly, to an integration method of fabricating an optical sensor device and a thin film transistor device.

2. Description of the Prior Art

With continuously innovation of the electronic product, in addition to viewing image information, more and more display panels have been added with touch input function to become a human computer interaction interface. Recently, the optical sensor device is also gradually applied to the display panel, and for example, is used as a fingerprint sensor. However, since the process and the device property of the optical sensor device and the process and the device property of the thin film transistor device are not exactly the same, there are some issues encountered in fabricating process and needed to be improved, such as the complicated steps of the fabricating process and the damage to the optical sensor device.

SUMMARY OF THE INVENTION

It is therefore one of the objectives of the present invention to provide a method of fabricating an optical sensor device and a thin film transistor device to simplify process and increase reliability and yield.

According to an embodiment of the present invention, a method of fabricating an optical sensor device and a thin film transistor device including the following steps is provided. A substrate is provided, and the substrate has a switching device region and an optical sensor device region. A first patterned metal layer is formed on the substrate, wherein the first patterned metal layer includes a gate electrode disposed in the switching device region, and a bottom electrode disposed in the optical sensor device region. A first insulating layer is formed on the first patterned metal layer, the first insulating layer covers the gate electrode, and the first insulating layer at least partially exposes the bottom electrode. The optical sensing pattern is formed on the bottom electrode. A patterned transparent semiconductor layer is formed on the first insulating layer, wherein the patterned transparent semiconductor layer includes a first transparent semiconductor pattern covering the gate electrode, and a second transparent semiconductor pattern covering the optical sensing pattern. A second patterned metal layer is formed on the patterned transparent semiconductor layer, wherein the second patterned metal layer comprises a source electrode and a drain electrode partially covering the first transparent semiconductor pattern respectively, and the second patterned metal layer at least partially exposes the second transparent semiconductor pattern. A modification process is performed on the second transparent semiconductor pattern, and the modification process includes introducing at least one gas to transfer the second transparent semiconductor pattern into a transparent top electrode with electrical conductibility.

According to another embodiment of the present invention, a method of fabricating an optical sensor device and a thin film transistor device including the following steps is provided. A substrate is provided, and the substrate has a switching device region and an optical sensor device region. A first patterned metal layer is formed on the substrate, wherein the first patterned metal layer includes a first pattern disposed in the switching device region, and a second pattern disposed in the optical sensor device region. A first insulating layer is formed on the first patterned metal layer, and the first insulating layer covers the first pattern and the second pattern. A second patterned metal layer is formed on the first insulating layer, wherein the second patterned metal layer includes a source electrode and a drain electrode, and the source electrode and the drain electrode are disposed on the first pattern in the switching device region. A patterned transparent semiconductor layer is formed on the first insulating layer, wherein the patterned transparent semiconductor layer includes a first transparent semiconductor pattern partially covering the source electrode and the drain electrode, and a second transparent semiconductor pattern disposed in the optical sensor device region. A second insulating layer is formed on the first insulating layer, wherein the second insulating layer covers the first transparent semiconductor pattern and at least partially exposes the second transparent semiconductor pattern. An optical sensing pattern is formed on the second insulating layer in the optical sensor device region, wherein the optical sensing pattern covers the second transparent semiconductor pattern. A third patterned metal layer is formed on the second insulating layer, wherein the third patterned metal layer includes a gate electrode, the gate electrode is disposed on the first transparent semiconductor pattern, and the third patterned metal layer at least partially exposes the second transparent semiconductor pattern. A third insulating layer is formed on the third patterned metal layer, wherein the third insulating layer at least partially exposes the drain electrode. A first patterned transparent conductive layer is formed on the third insulating layer, wherein the first patterned transparent conductive layer includes a transparent top electrode, and the transparent top electrode covers the optical sensing pattern. A modification process is performed on the second transparent semiconductor pattern, the modification process comprising introducing at least one gas to transfer the second transparent semiconductor pattern into a transparent bottom electrode with electrical conductibility.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the invention, exemplary embodiments will be detailed as follows. The exemplary embodiments of the invention are illustrated in the accompanying drawings with numbered elements to elaborate the contents and effects to be achieved.

Figure 1:
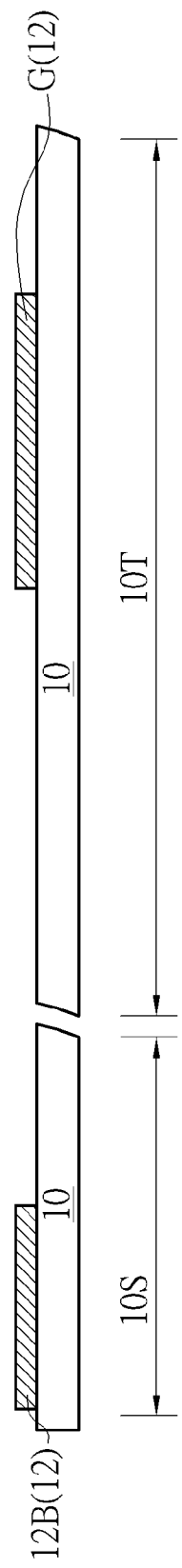
FIGS. 1-5 are schematic diagrams illustrating a method of fabricating an optical sensor device and a thin film transistor device according to a first embodiment of the present invention.

Refer to FIGS. 1-5. FIGS. 1-5 are schematic diagrams illustrating a method of fabricating an optical sensor device and a thin film transistor device according to a first embodiment of the present invention. As shown in FIG. 1, a substrate 10 is provided first. The substrate 10 may include a transparent substrate, such as a glass substrate, a plastic substrate, a quartz substrate, a sapphire substrate or other suitable substrates, and the substrate 10 may be chosen to be a rigid substrate or flexible substrate. The substrate 10 includes a switching device region 10T and an optical sensor device region 10S. Following that, a first patterned metal layer 12, which include metal or alloy and may be a single layer structure or a multilayer stack structure stacked together, is formed on the substrate 10. In each example of this embodiment, the first patterned metal layer 12 or other patterned films may be formed by utilizing a deposition process together with a photolithography and etching processes, a lift-off process or other suitable patterning processes. The first patterned metal layer 12 includes a gate electrode G disposed in the switching device region 10T, and a bottom electrode 12B disposed in the optical sensor device region 10S, in which the gate electrode G serves as a gate of the thin film transistor device, and the bottom electrode 12B serves a bottom electrode of the optical sensor device.

Figure 2:
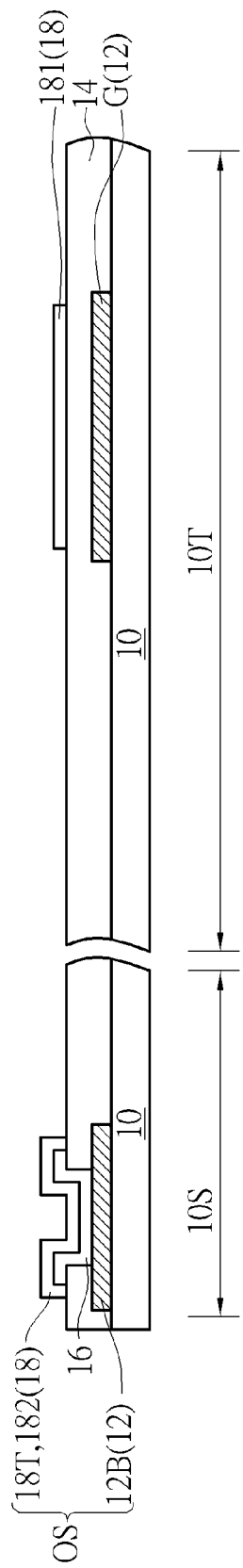

As shown in FIG. 2, a first insulating layer 14 is then formed on the substrate 10 and the first patterned metal layer 12. A material of the first insulating layer 14 may be for instance silicon oxide, silicon nitride or silicon oxynitride, but not limited thereto. The material of the first insulating layer 14 may also include an organic material, and may be a single layer structure or a multilayer stack structure. Thereafter, a patterning process is performed on the first insulating layer 14 to remove a part of the first insulating layer 14. The first insulating layer 14 used as a gate insulating layer covers the gate electrode G, and the first insulating layer 14 at least partially exposes the bottom electrode 12B. Next, an optical sensing pattern 16 is formed on the bottom electrode 12B. The optical sensing pattern 16 which has an optical sensing property may serve as an optical sensing layer of the optical sensor device and produce photocurrent under the illumination of light. The optical sensing pattern 16 may be a single layer structure or a multilayer stack structure. In this embodiment, a material of the optical sensing pattern 16 may be a silicon (Si) rich dielectric material that is a dielectric material has a stoichiometry of silicon larger than stoichiometry of other compositions, such as Si-rich silicon oxide (SiOx), where x<2. The material of the optical sensing pattern 16 may be other silicon rich dielectric material, such as Si-rich silicon nitride (SiNy), Si-rich silicon carbide (SiCz), Si-rich silicon oxynitride (SiOxNy), Si-rich silicon oxycarbide (SiOxCz), hydrogenated Si-rich silicon oxide (SiHwOx), hydrogenated Si-rich oxynitride (SiHwOxNy) or a stack layer of the aforementioned materials, where w<4, x<2, y<1.34, z<1, but the present invention is not limited thereto. In a variant embodiment, the optical sensing pattern 16 may also be another material both having optical sensing property and generating a photo-induced current, for instance a semiconductor material. For example, the material of the optical sensing pattern 16 may be, but not limited to, amorphous silicon or a P-N diode layer formed of group III-V materials or group II-VI materials, a P-I-N diode layer, P-I diode layer or an N-I diode layer.

Subsequently, a patterned transparent semiconductor layer 18 is formed on the first insulating layer 14. In this embodiment, a material of the patterned transparent semiconductor layer 18 is an oxide semiconductor material, such as indium gallium zinc oxide (IGZO), but not limited thereto. In another variant embodiment, the material of the patterned transparent semiconductor layer 18 also may include silicon, such as amorphous silicon, polysilicon or other suitable semiconductor materials. The patterned transparent semiconductor layer 18 includes a first transparent semiconductor pattern 181 covering the gate electrode G, and a second transparent semiconductor pattern 182 covering the optical sensing pattern 16. Specifically, the first transparent semiconductor pattern 181 serving as a channel layer of the thin film transistor device is disposed on the gate insulating layer 14 and substantially corresponds to the gate electrode G, and the second transparent semiconductor pattern 182 is disposed on the optical sensing pattern 16 and contacts the optical sensing pattern 16. It is worth noting that besides covering the bottom electrode 12B, the optical sensing pattern 16 may further partially cover the first insulating layer 14, and thus, the second transparent conductive pattern 182 may be prevented from contacting the bottom electrode 12B and being shorted to the bottom electrode 12B. The method of the present embodiment further includes performing a modification process including introducing at least one gas to transfer the second transparent semiconductor pattern 182 into a transparent top electrode 18T with electrical conductibility to be used as a top electrode of the optical sensor device, such that the bottom electrode 12B, the optical sensing pattern 16 and the transparent top electrode 18T transferred from the second transparent semiconductor pattern 182 may form the optical sensor device OS. In addition, after the modification process, the first transparent semiconductor pattern 181 keeps the semiconductor property. For example, while performing the modification process, a mask pattern may be used to cover the first transparent semiconductor pattern 181, so that the first transparent semiconductor pattern 181 is not affected by the modification process. The mask pattern may be a photoresist or other structure layer. The modification process may be performed at any time after the second transparent semiconductor pattern 182 is formed. For example, the modification process of this embodiment may be a hydrogenation process that may hydrogenate the second transparent semiconductor pattern 182 thereby transferring the second transparent semiconductor pattern 182 from a semiconductor into the transparent top electrode 18T with electrical conductibility. The modification process may include an anneal process, and composition of the introduced gas includes hydrogen. For example, introducing the gas may be introducing vapor or clean dry air. That is, the modification process may include a H2O anneal process or a clean dry air anneal (CDA anneal) process, where the clean dry air includes, but not limited to, 25% of oxygen or other gas containing hydrogen. In a variant embodiment, the modification process may include a plasma process, and the introduced gas may include hydrogen or other gas containing hydrogen, which is hydrogen plasma process. In another embodiment, when the second transparent semiconductor pattern 182 is formed of silicon or other semiconductor materials, the modification process may also be an ion implantation process which implants dopants such as P-type dopants or N-type dopants into the second transparent semiconductor pattern 182, so that the second transparent semiconductor pattern 182 may be transferred from the semiconductor into the transparent top electrode 18T with electrical conductibility, or other suitable modification process.

Figure 3:
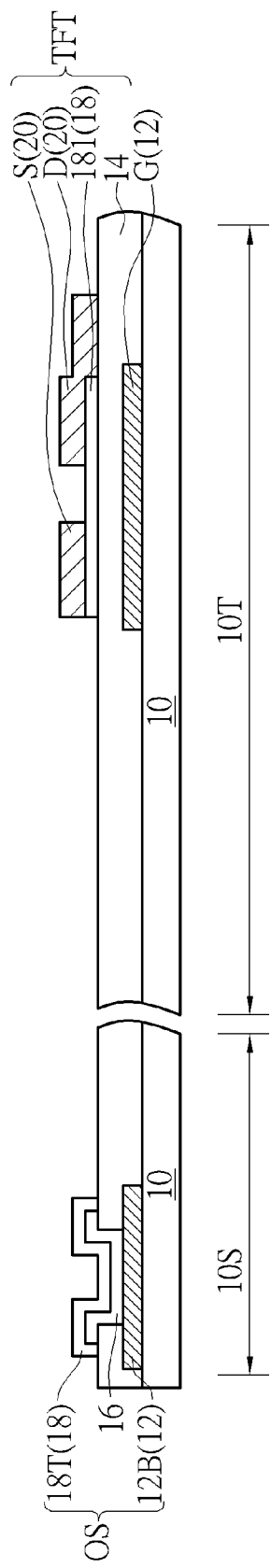

As shown in FIG. 3, a second patterned metal layer 20 is formed on the patterned transparent semiconductor layer 18. A material of the second patterned metal layer 20 may include metal or alloy, and may be a single layer structure or a multilayer stack structure. The second patterned metal layer 20 includes a source electrode S and a drain electrode D partially covering the first transparent semiconductor pattern 181 respectively. By the above-mentioned steps, the thin film transistor device TFT may be fabricated in the switching device region 10T. Furthermore, the second patterned metal layer 20 at least partially exposes the transparent top electrode 18T, and thus, the optical sensor device OS fabricated in the optical sensor device region 10S may detect light signals through an opening of the second patterned metal layer 20. It is worth noting that a size of the gate electrode is preferably larger than a size of the first transparent semiconductor pattern 181, and a size of the bottom electrode 12B is preferably larger than a size of the transparent top electrode 18T in order to avoid the thin film transistor device TFT and the optical sensor device OS producing the photo-induced current. In this embodiment, the thin film transistor device TFT may be electrically connected to the optical sensor device OS to be a driving device of the optical sensor device OS or be electrically connected to a pixel structure for displaying to be a driving device or a switching device of the pixel structure. In addition, the thin film transistor device is a bottom gate type thin film transistor device, but is not limited thereto. In another embodiment, the thin film transistor device TFT also may be a top gate type thin film transistor device, double gate type thin film transistor device or other type thin film transistor devices.

Figure 4:
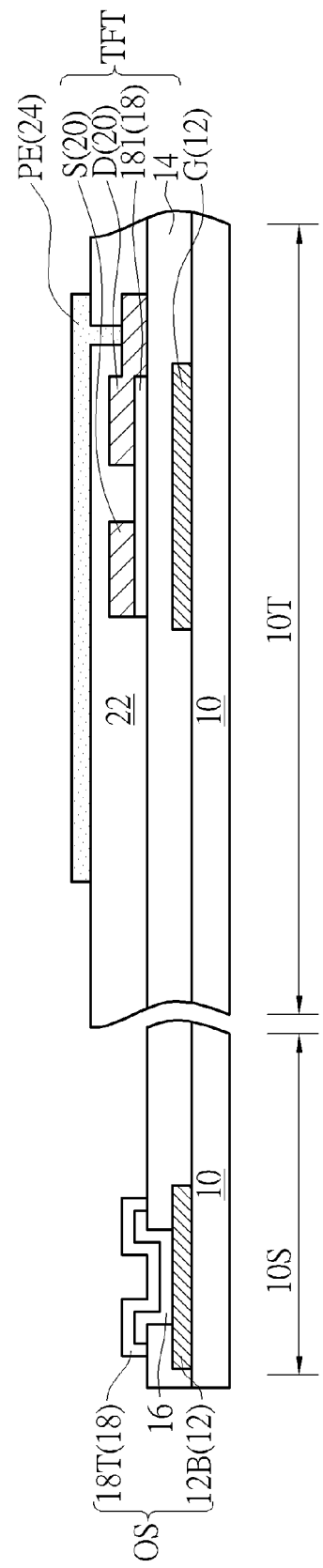

The method of fabricating the optical sensor device and the thin film transistor device of this embodiment may selectively further be integrated with a process of the pixel structure to be an application of the display panel with the optical sensor device. Please continue to refer to FIG. 4 and FIG. 5. As shown in FIG. 4, a second insulating layer 22 and a first patterned transparent conductive layer 24 are then sequentially formed on the second patterned metal layer 20. Specifically, the second insulating layer 22 is formed on the second patterned metal layer 20 earlier. The second insulating layer 22 may include an inorganic insulating layer such as but not limited to silicon oxide layer, silicon nitride layer, silicon oxynitride layer, or an organic insulating layer. The second insulating layer 22 covers the first transparent semiconductor pattern 181, at least partially exposes the transparent top electrode 18T after patterning, and exposes a part of the drain electrode D.

Thereafter, the first patterned transparent conductive layer 24 is formed on the second insulating layer 22. A material of the first patterned transparent conductive layer 24 includes metal oxide (such as indium tin oxide (ITO), indium zinc oxide (IZO) or other suitable conductive material), metal nitride, metal oxynitride, metal material, metal alloy material (such as several metal combination or other suitable material), carbon nanotube, graphene, conductive nanowire, other suitable conductive material, or a multilayer structure of a stack of at least parts of aforementioned materials. The first patterned transparent conductive layer 24 includes a pixel electrode PE, and the pixel electrode PE is connected to the drain electrode D.

Figure 5:
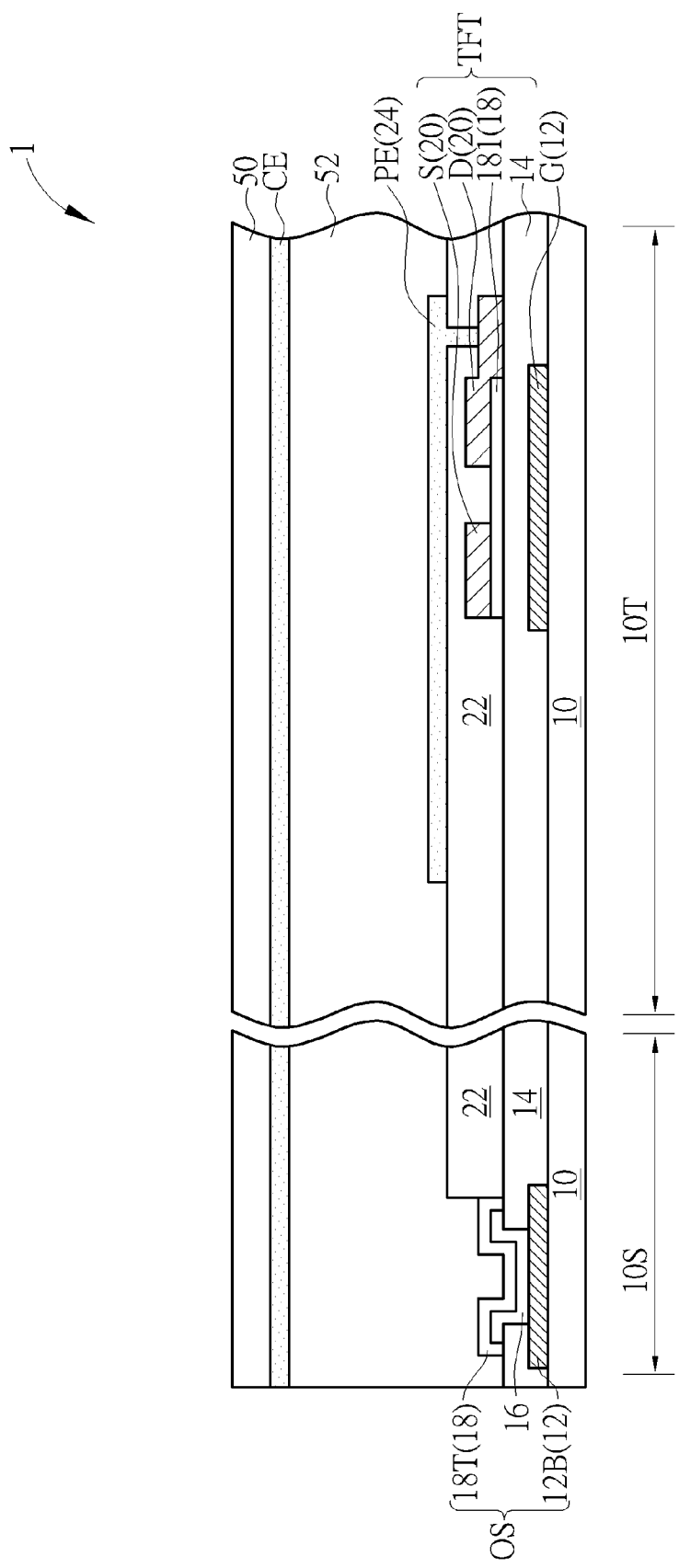

As shown in FIG. 5, another substrate 50 is provided, and a common electrode CE is formed on the substrate 50. Next, the substrate 10 is combined with the substrate 50, and a display medium layer 52 is formed between the substrate 10 and the substrate 50 to from the display panel 1 of this embodiment. The display medium layer 52 includes a liquid crystal layer or other suitable non-self-luminescent display medium layer or self-luminescent display medium layer. The display panel 1 of this embodiment may be for example a vertical electric field driving type liquid crystal display panel, such as a twisted nematic (TN) type liquid crystal display panel or a vertical aligned (VA) type liquid crystal display panel, but not limited thereto. For instance, the display panel of the present invention may also be a horizontal electric field driving type liquid crystal display panel, such as an in-plane switching (IPS) liquid crystal display panel, a fringe field switching (FFS) liquid crystal display panel or other type display panels. In a variant embodiment, the first patterned transparent conductive layer 24 may also include the pixel electrode PE and the common electrode (no shown in figures), which is used as an application of the IPS liquid crystal display panel.

The display panel 1 of this embodiment may be further combined with the backlight module (not shown in figures) to achieve displaying function through light source provided by the backlight module. Or, the display panel 1 also may use ambient light as the light source to achieve the displaying function. Otherwise, the optical sensor device OS may be a touch input device or a fingerprint sensing device. In other words, a finger of user or an input device may shield the ambient light to change intensity of light received by the optical sensor device OS while performing touch inputting at an input position or fingerprint identifying, so that the input position or the fingerprint may be determined. Or, the user may use the input device with active emitting function, such that the optical sensing device OS may receive different lights at the input position, thereby determining the input position or the fingerprint. Or, the light is emitted to the finger or the input device through the light source provided by the backlight and then reflected to the optical sensor device OS, such that the input device or the fingerprint may be determined according to the sensing result of the optical sensor devices OS at different positions.

The method of fabricating the optical sensor device and the thin film transistor device and the method of fabricating the display panel are not limited by the aforementioned embodiment, and may have other different embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 6:
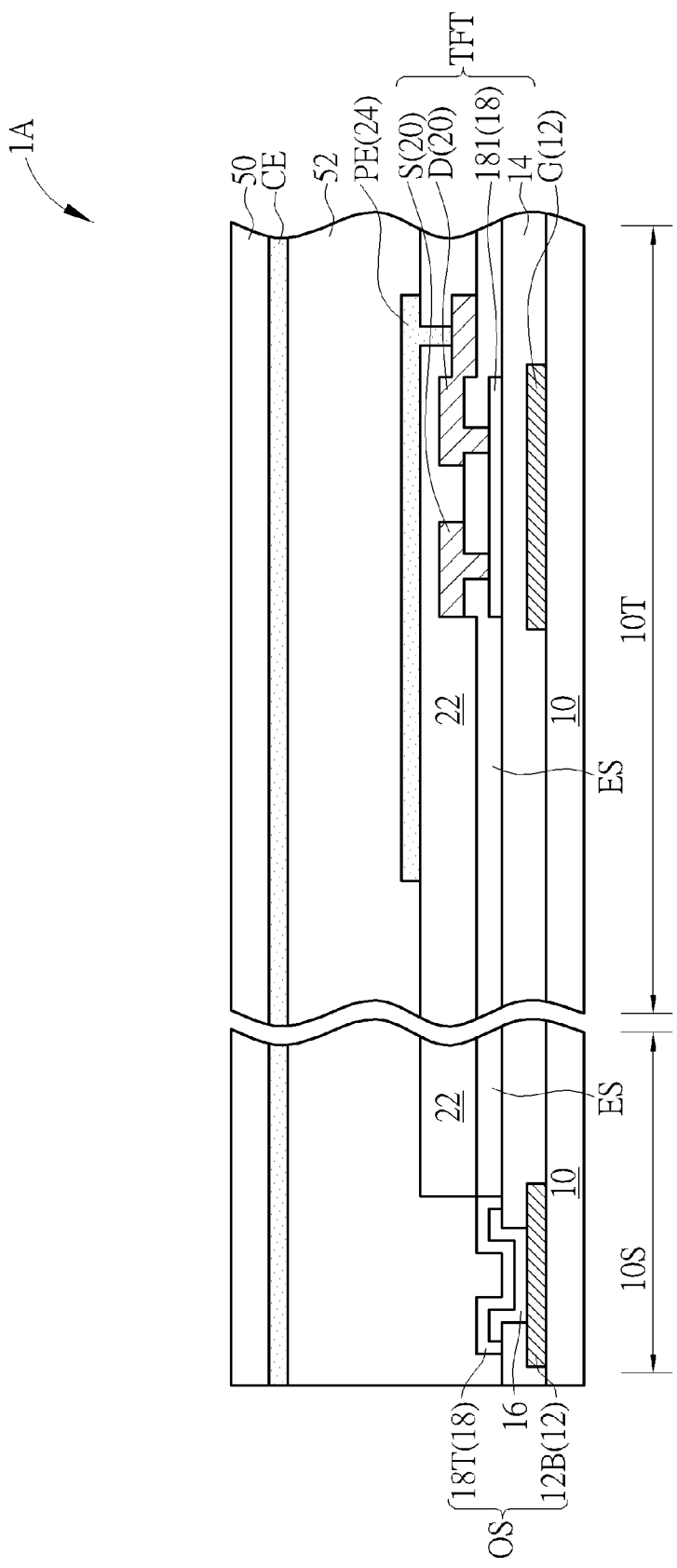
FIG. 6 is a schematic diagram illustrating a method of fabricating an optical sensor device and a thin film transistor device according to a variant embodiment of the first embodiment of the present invention.

Please refer to FIG. 6 together with FIG. 1 and FIG. 2. FIG. 6 is a schematic diagram illustrating a method of fabricating an optical sensor device and a thin film transistor device according to a variant embodiment of the first embodiment of the present invention. As shown in FIG. 6, the method of the variant embodiment may selectively include forming an etching stop layer ES on the first insulating layer 14 and the first transparent semiconductor pattern 181 before forming the second patterned metal layer 20, wherein the etching stop layer ES may protect the first transparent semiconductor pattern 181 from damage during forming the second patterned metal layer 20. The etching stop layer ES exposes the transparent top electrode 18T and partially exposes the first transparent semiconductor pattern 181, and the source electrode S and the drain electrode D formed thereafter are connected to the first transparent semiconductor pattern 181 exposed by the etching stop layer ES. A material of the etching stop layer ES may be an inorganic material, such as silicon oxide, silicon nitride or silicon oxynitride, but not limited thereto. Next, the display panel 1A of this embodiment is formed by the following steps shown in FIGS. 4 and 5.

Figure 7:
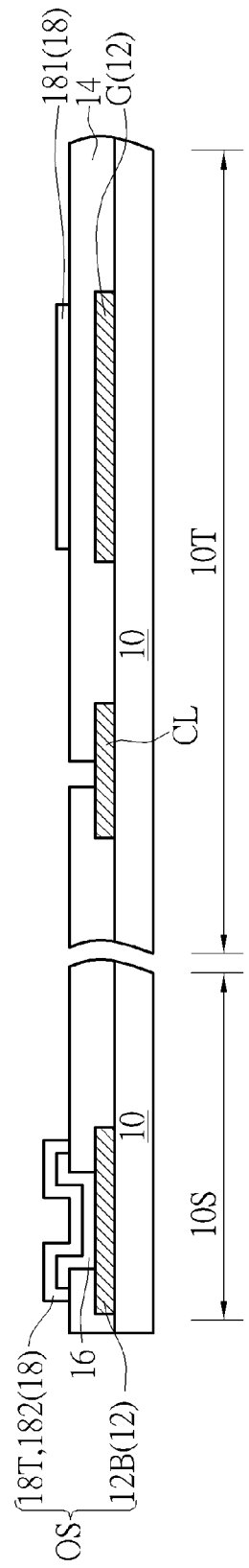
FIGS. 7-10 are schematic diagrams illustrating a method of fabricating an optical sensor device and a thin film transistor device according to a second embodiment of the present invention.

Please refer to FIGS. 7-10. FIGS. 7-10 are schematic diagrams illustrating a method of fabricating an optical sensor device and a thin film transistor device according to a second embodiment of the present invention. As shown in FIG. 7, the substrate 10 is first provided, and then, the first patterned metal layer 12 is formed on the substrate 10. The first patterned metal layer 12 not only includes the gate G disposed in the switching device region 10T and the bottom electrode 12B disposed in the optical sensor device region 10S, but also may selectively include a common line CL disposed in the switching device region 10T, where the common line CL is used to transfer a common voltage. Next, the first insulating layer 14 is formed on the substrate 10 and the first patterned metal layer 12, wherein the first insulating layer 14 covers the gate electrode G and serves as a gate insulating layer, and the first insulating layer 14 at least partially exposes the bottom electrode 12B and at least partially exposes the common line CL. Subsequently, the optical sensing pattern 16 is formed on the bottom electrode 12B. Then, the patterned transparent semiconductor layer 18 is formed on the first insulating layer 14. The patterned transparent semiconductor layer 18 includes the first transparent semiconductor pattern 181 covering the gate electrode G, and the second transparent semiconductor pattern 182 covering the optical sensing pattern 16. Specifically, the first transparent semiconductor pattern 181 is disposed on the gate insulating layer 14 and substantially corresponds to the gate electrode G, so that the first transparent semiconductor pattern 181 may serve as a channel layer of the thin film transistor device. The second transparent semiconductor pattern 182 is disposed on the optical sensing pattern 16 and contacts the optical sensing pattern 16. The method of this embodiment may further include the modification process including introducing at least one gas to transfer the second transparent semiconductor pattern 182 into the transparent top electrode 18T with electrical conductivity that serves as the top electrode of the optical sensor device, and the bottom electrode 12B, the optical sensing pattern 16 and the transferred transparent top electrode 18T may accordingly form the optical sensor device OS. The modification process may be performed at any time after the second transparent semiconductor pattern 18 is formed. For example, the modification process of this embodiment may be a hydrogenation process that may hydrogenate the second transparent semiconductor pattern 182 thereby transferring the second transparent semiconductor pattern 182 from the semiconductor into the transparent top electrode 18T with electrical conductibility. The modification process may include an anneal process, and composition of the introduced gas includes hydrogen. For example, introducing the gas may be introducing vapor or clean dry air. That is, the modification process may include a $H_2O$ anneal process or a clean dry air anneal (CDA anneal) process, where the clean dry air includes, but not limited to, 25% of oxygen or other gas containing hydrogen. In a variant embodiment, the modification process may include a plasma process, and the introduced gas may include hydrogen (that is hydrogen plasma process) or other gas containing hydrogen. In another embodiment, when the second transparent semiconductor pattern 182 is formed of silicon or other semiconductor materials, the modification process may also be anion implantation process which implants dopants such as P-type dopants or N-type dopants into the second transparent semiconductor pattern 182, so that the second transparent semiconductor pattern 182 may be transferred from the semiconductor into the transparent top electrode 18T with electrical conductibility, or other suitable modification process.

Figure 8:
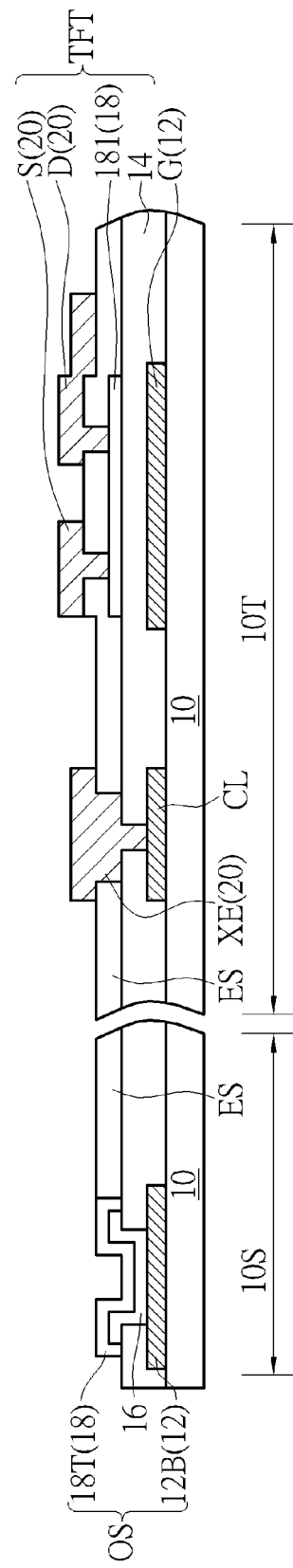

As shown in FIG. 8, the etching stop layer ES may be selectively formed on the first insulating layer 14 and the first transparent semiconductor pattern 181. The etching stop layer ES exposes the transparent top electrode 18T and partially exposes the first transparent semiconductor pattern 181 and the common line CL. Next, the second patterned metal layer 20 is formed on the etching stop layer ES and connected to the first transparent semiconductor pattern 181 and the common line CL respectively. The second patterned metal layer 20 may further selectively include a connection electrode XE in addition to the source electrode S and the drain electrode D. The connection electrode XE is connected to the common line CL exposed by the first insulating layer 14. Furthermore, the second patterned metal layer 20 at least partially exposes the transparent top electrode 18T. Through the aforementioned steps, the thin film transistor device TFT may be fabricated in the switching device region 10T as well as the optical sensor device OS being fabricated in the optical sensor device region 10S.

Figure 9:
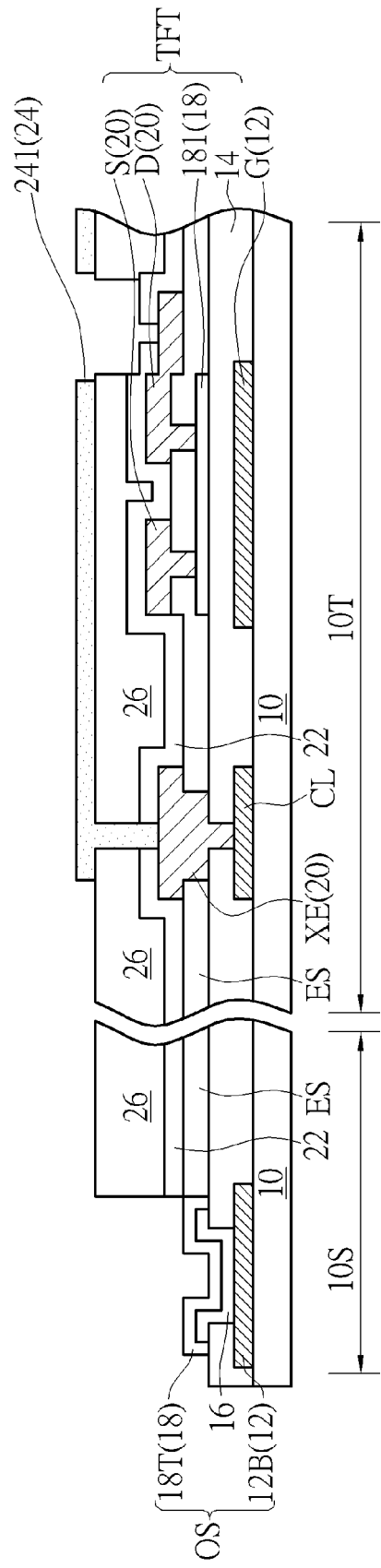

The method of fabricating the optical sensor device and the thin film transistor device of this embodiment may selectively further be integrated with a process of the pixel structure to be an application of the display panel with the optical sensor device. Please continue to refer to FIG. 9 and FIG. 10. As shown in FIG. 9, the second insulating layer 22 and the first patterned transparent conductive layer 24 are then sequentially formed on the second patterned metal layer 20. Specifically, the second insulating layer 22 is formed on the second patterned metal layer 20 earlier, and the second insulating layer 22 at least partially exposes the transparent top electrode 18T, a part of the drain electrode D and a part of the connection electrode XE. The above-mentioned step of forming the second insulating layer 22 may include performing a deposition process, such as chemical vapor deposition process, and the aforementioned modification process may include introducing the gas while performing the chemical vapor deposition process to transfer the second transparent semiconductor pattern 182 into the transparent top electrode 18T, wherein the introduced gas may include a mixture of silane gas, ammonia gas and nitrogen gas, but not limited thereto. In other words, the method of this embodiment may simultaneously perform the deposition process and the hydrogenation process to increase content of hydrogen in the second transparent semiconductor pattern 182 thereby transferring the semiconductor into a conductor, and the transferred second transparent semiconductor pattern 182 may serve as the transparent top electrode 18T. In a specific example, a flow ratio of ammonia gas to silane gas is substantially 6. For example, a flow of ammonia gas is 2160 sccm, a flow of silane gas is 360 sccm, and a flow of nitrogen gas is 2800 sccm, but not limited thereto. It is worth noting that the first transparent semiconductor pattern 181 won't be affected by the modification process because of being covered with the etching stop layer ES, which means the first transparent semiconductor pattern 181 maintain its semiconductor property after the modification process. Thereafter, the first patterned transparent conductive layer 24 is formed on the second insulating layer 22. The first patterned transparent conductive layer 24 includes a first electrode 241 and exposes the transparent top electrode 18T. It is worth to note that the method of this embodiment may selectively include forming a fourth insulating layer 26 on the second insulating layer 22 before forming the first patterned transparent conductive layer 24. The fourth insulating layer 26 at least partially exposes the transparent top electrode 18T and the drain electrode D, and the fourth insulating layer 26 may include, but not limited to, inorganic insulating layer, such as silicon oxide layer, silicon nitride layer, silicon oxynitride layer, or organic insulating layer, but the present invention is not limited thereto.

Figure 10:
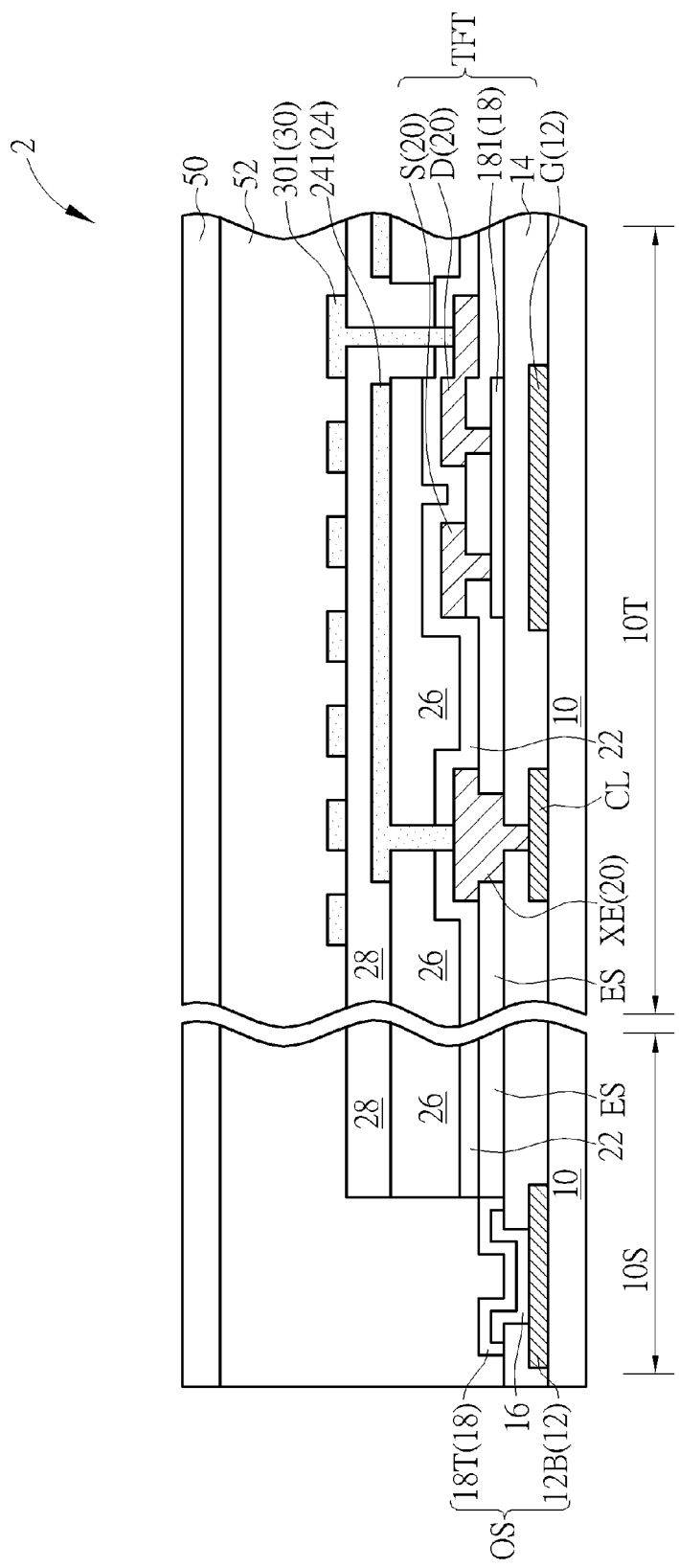

As shown in FIG. 10, subsequently, a third insulating layer and a second patterned transparent conductive layer 30 are sequentially formed on the first patterned transparent conductive layer 24. Specifically, the third insulating layer 28 is formed on the first patterned transparent conductive layer 24 prior to the second patterned transparent conductive layer 30. The third insulating layer 28 exposes the transparent top electrode 18T and at least exposes the drain electrode D. The third insulating layer 28 may include an inorganic insulating layer, such as silicon oxide layer, silicon nitride layer, silicon oxynitride layer, but not limited thereto, or an organic insulating layer, but not limited thereto. Next, the second patterned transparent conductive layer 30 is formed on the third insulating layer 28, where the second patterned transparent conductive layer 30 includes a second electrode 301, and the second patterned transparent conductive layer 30 exposes the transparent top electrode 18T. One of the first electrode 241 and the second electrode 301 is connected to the drain electrode D, and the other one of the first electrode 241 and the second electrode 301 is connected to the connection electrode XE. For example, in this embodiment, the first electrode 241 is the common electrode connected to the connection electrode XE, thereby receiving the common voltage through being connected to the common line CL, and the second electrode 301 is the pixel electrode connected to the drain electrode D, thereby receiving the pixel voltage, but not limited thereto. In addition, the first electrode 241 is a full-surfaced electrode. The second electrode 301 that is a patterned electrode may include for example a plurality of branch electrodes, and a slit exists between the adjacent branch electrodes, but not limited thereto. Later, the substrate 10 is combined with the other one substrate 50, and the display medium layer 52 is then formed between the substrate 10 and the substrate 50 to form the display panel 2 of this embodiment.

In this embodiment, the above-mentioned step of forming the third insulating layer 28 may include performing a deposition process, such as chemical vapor deposition process, and the aforementioned modification process may include introducing the gas simultaneously while performing the chemical vapor deposition process to transfer the second transparent semiconductor pattern 182 into the transparent top electrode 18T, wherein the introduced gas may include a mixture of silane gas, ammonia gas and nitrogen gas, but not limited thereto. In other words, the method of this embodiment may simultaneously perform the deposition process and the hydrogenation process to increase content of hydrogen in the second transparent semiconductor pattern 182 thereby transferring the semiconductor into the conductor, and the transferred second transparent semiconductor pattern 182 may serve as the transparent top electrode 18T. In a specific example, a flow ratio of ammonia gas to silane gas is substantially 6. For example, a flow of ammonia gas is 2160 sccm, a flow of silane gas is 360 sccm, and a flow of nitrogen gas is 2800 sccm, but not limited thereto. It is worth noting that if the modification process is performed right after the second transparent semiconductor pattern 182 is formed, the transparent top electrode 18T may be damaged while performing patterning process on any one of the second insulating layer 22, the second patterned metal layer 20, the fourth insulating layer 26 and the first patterned transparent conductive layer 24. Accordingly, when the modification process is integrated with the process of forming the third insulating layer 28, not only no extra process step is increased, but also the damage of the transparent top electrode 18T in the above patterning process may be repaired to guarantee the transparent top electrode 18T to have good conductivity.

Figure 11:
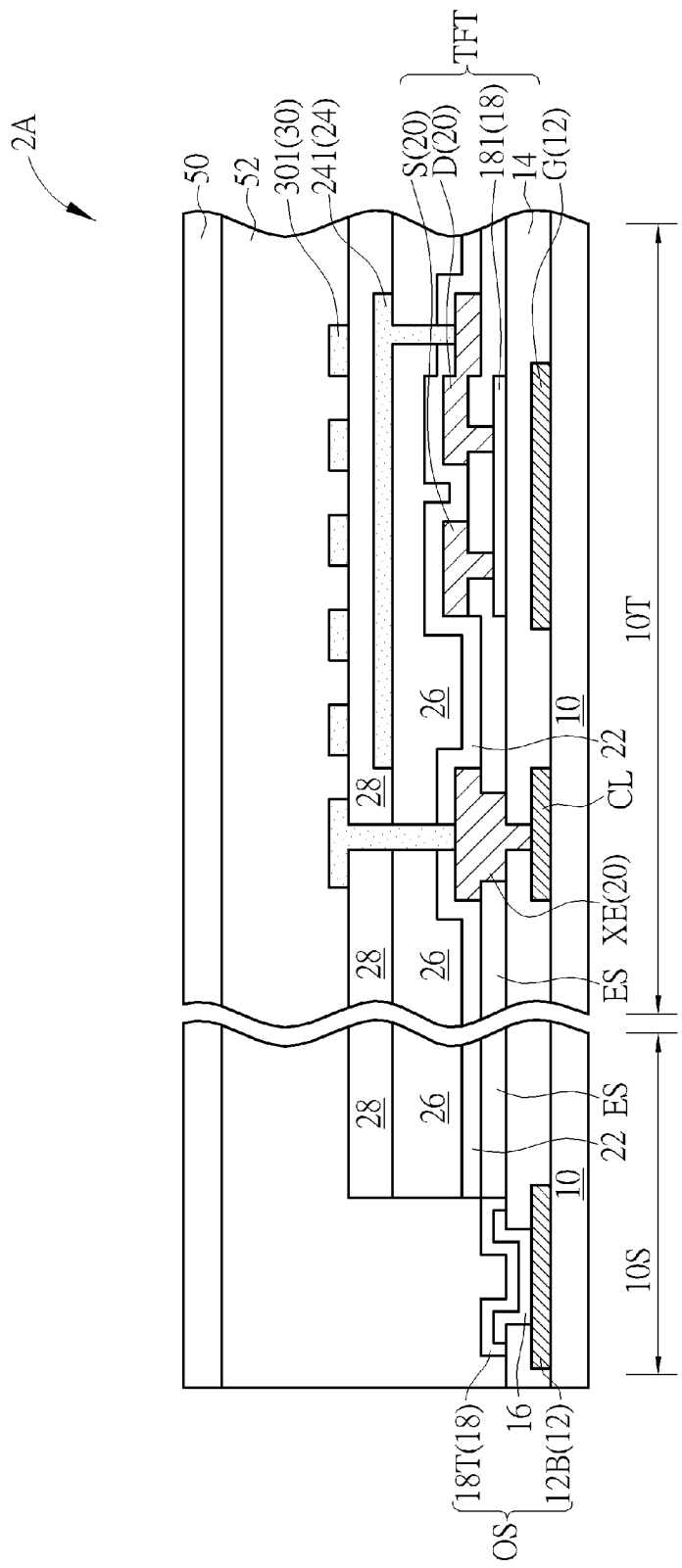
FIG. 11 is a schematic diagram illustrating a method of fabricating an optical sensor device and a thin film transistor device according to a variant embodiment of the second embodiment of the present invention.

Please refer to FIG. 11. FIG. 11 is a schematic diagram illustrating a method of fabricating an optical sensor device and a thin film transistor device according to a variant embodiment of the second embodiment of the present invention. As shown in FIG. 11, different from the second embodiment, in the display panel 2A of this variant embodiment, the first electrode 241 of the first patterned transparent conductive layer 24 is the pixel electrode connected to the drain electrode D, and the second electrode 301 of the second patterned transparent conductive layer 30 is the common electrode connected to the connection electrode XE.

Figure 12:
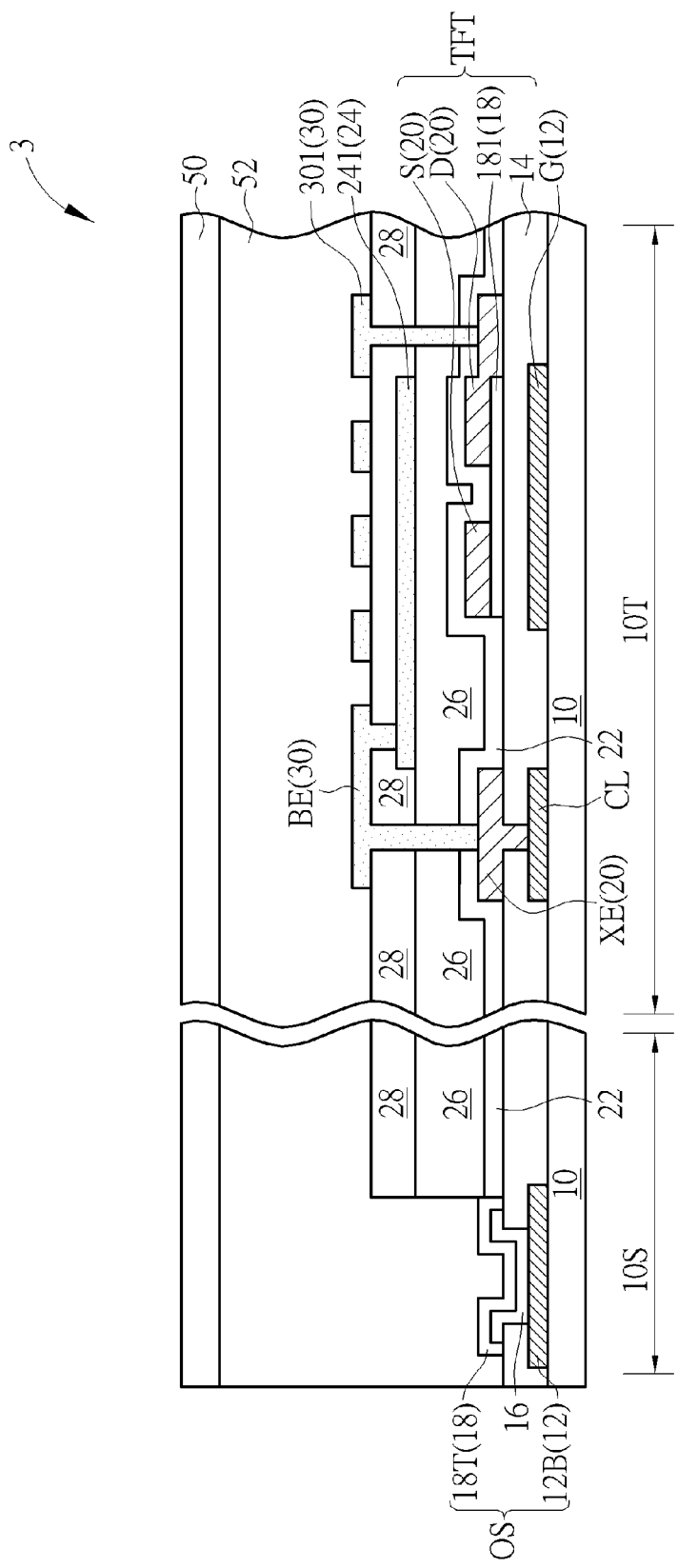
FIG. 12 is a schematic diagram illustrating a method of fabricating an optical sensor device and a thin film transistor device according to a third embodiment of the present invention.

Please refer to FIG. 12. FIG. 12 is a schematic diagram illustrating a method of fabricating an optical sensor device and a thin film transistor device according to a third embodiment of the present invention. As shown in FIG. 12, the difference between the third embodiment and the second embodiment is that the second patterned transparent conductive layer 30 of the third embodiment further includes a bridge electrode BE connected to the first electrode 241 serving as the common electrode and the connection electrode XE respectively. In other words, the first electrode 241 is not directly connected to the connection electrode XE, but is connected to the connection electrode XE through the bridge electrode BE thereby receiving the common voltage. By the above-mentioned method, the display panel 3 of this embodiment may be fabricated.

Figure 13:
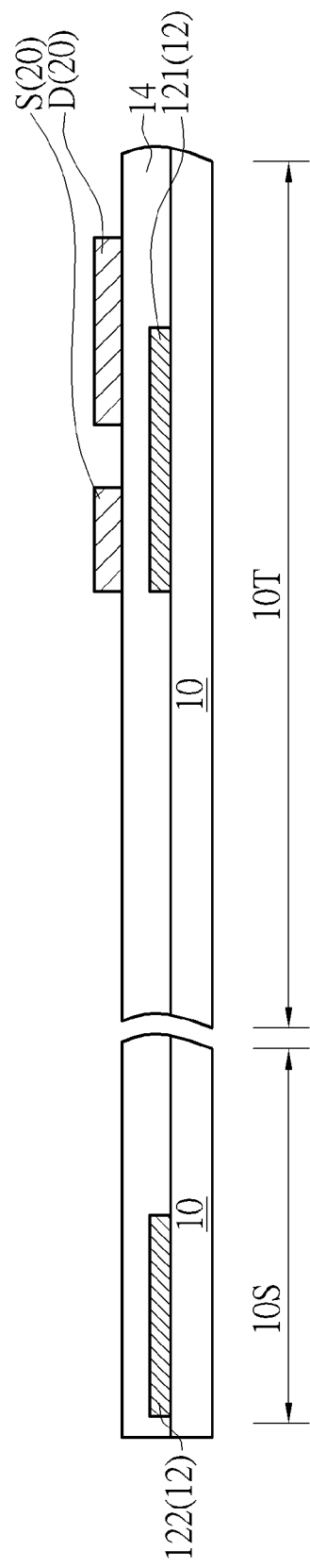
FIGS. 13-16 are schematic diagrams illustrating a method of fabricating an optical sensor device and a thin film transistor device according to a fourth embodiment of the present invention.

Please refer to FIGS. 13-16. FIGS. 13-16 are schematic diagrams illustrating a method of fabricating an optical sensor device and a thin film transistor device according to a fourth embodiment of the present invention. As shown in FIG. 13, the substrate 10 which includes the switching device region 10T and the optical sensor device region 10S is first provided. Next, the first patterned metal layer 12 is formed on the substrate 10, wherein the material of the first patterned metal layer 12 may include metal or alloy, and may be a single layer structure or a multilayer stack structure. The first patterned metal layer 12 of this embodiment has a shielding property. The first patterned metal layer 12 includes a first pattern 121 disposed in the switching device region 10T, and a second pattern 122 disposed in the optical sensor device region 10S. Next, the first insulating layer 14 is formed on the substrate 10 and the first patterned metal layer 12, wherein the first insulating layer 14 covers the first pattern 121 and the second pattern 122. Following that, the second patterned metal layer 20 is formed on the first insulating layer 14, wherein the material of the second patterned metal layer 20 may include metal or alloy, and may be a single layer structure or a multilayer stack structure. The second patterned metal layer 20 includes the source electrode S and the drain electrode D disposed above the first pattern 121 in the switching device region 10T.

Figure 14:
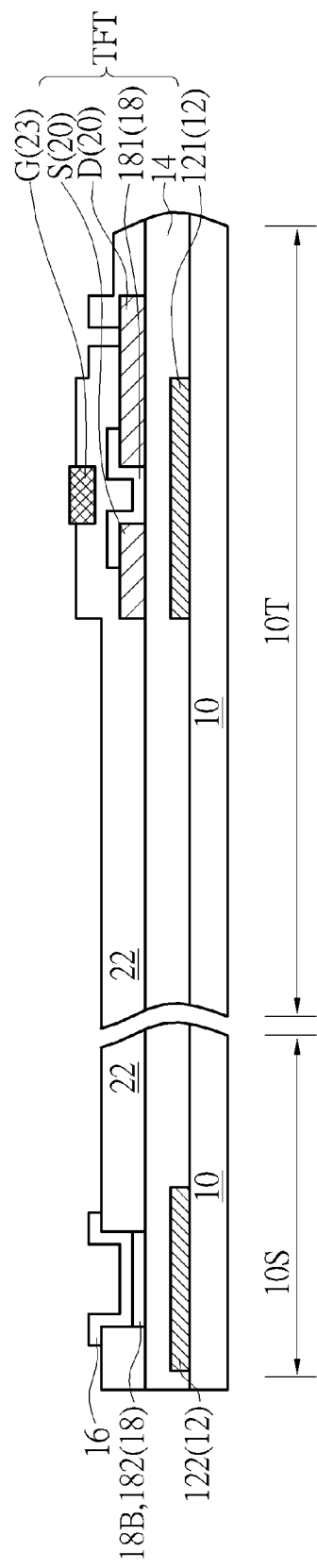

As shown in FIG. 14, the patterned transparent semiconductor layer 18 is then formed on the first insulating layer 14, wherein the patterned transparent semiconductor layer 18 includes the first transparent semiconductor pattern 181 disposed in the switching device region 10T and covering the source electrode S and the drain electrode D, and a second transparent semiconductor pattern 182 disposed in the optical sensor device region 10S. In this embodiment, a material of the patterned transparent semiconductor layer 18 is an oxide semiconductor material, such as indium gallium zinc oxide (IGZO), but not limited thereto. In another variant embodiment, the material of the patterned transparent semiconductor layer 18 also may include silicon, such as amorphous silicon, polysilicon or other suitable semiconductor materials. Next, the second insulating layer 22 is formed on the first insulating layer 14. The second insulating layer 22 covers the second patterned metal layer 20 and the first transparent semiconductor pattern 181 and at least partially exposes the second transparent semiconductor pattern 182. Later, the optical sensing pattern 16 is formed on the second insulating layer 22 in the optical sensor device region 10S. The optical sensing pattern covers the second transparent semiconductor pattern 182. Furthermore, a third patterned metal layer 23 is formed on the second insulating layer 22. The third patterned metal layer 23 includes a gate electrode G disposed on the first transparent semiconductor pattern 181. If the step of forming the third patterned metal layer 23 is prior to the step of forming the optical sensing pattern 16, the third patterned metal layer 23 at least partially exposes the second transparent semiconductor pattern 182. A material of the third patterned metal layer 23 may include metal or alloy, and may be a single layer structure or a multilayer stack structure. The sequence of the step of forming the optical sensing pattern 16 and the step of forming the third patterned metal layer 23 in the method of this embodiment is not limited, so the step of forming the third patterned metal layer 23 may be prior to or posterior to the step of forming the optical sensing pattern 16. If the step of forming the third patterned metal layer 23 is posterior to the step of forming the optical sensing pattern 16, the third patterned metal layer 23 at least partially exposes the optical sensing pattern 16.

The method of this embodiment further includes performing a modification process including introducing at least one gas to transfer the second transparent semiconductor pattern 182 into a transparent bottom electrode 18B with electrical conductibility to be used as the bottom electrode of the optical sensor device. The modification process may be performed at any time after the second transparent semiconductor pattern 182 is formed. For example, the modification process of this embodiment may be a hydrogenation process that may hydrogenate the second transparent semiconductor pattern 182 thereby transferring the second transparent semiconductor pattern 182 from the semiconductor into the transparent bottom electrode 18B with electrical conductibility. The modification process may include an anneal process, and composition of the introduced gas includes hydrogen. For example, introducing the gas may be introducing vapor or clean dry air. That is, the modification process may include a $H_2O$ anneal process or a clean dry air anneal (CDA anneal) process, where the clean dry air includes, but not limited to, 25% of oxygen or other gas containing hydrogen. It is worthy to note that the modification process of this embodiment may further be integrated with the step of forming the optical sensing pattern 16, which means if the aforementioned gas is introduced in the step of forming the optical sensing pattern 16, the second transparent semiconductor pattern 182 may be transferred from the semiconductor into the transparent bottom electrode 18B in the step of forming the optical pattern 16, thereby simplifying process and saving manufacturing cost. In a variant embodiment, the modification process may include a plasma process, and the introduced gas may include hydrogen (that is hydrogen plasma process) or other gas containing hydrogen. In another embodiment, when the second transparent semiconductor pattern 182 is formed of silicon or other semiconductor materials, the modification process may also be an ion implantation process or other suitable modification process. In addition, after the modification process, the first transparent semiconductor pattern 181 keeps the semiconductor property. For example, while performing the modification process, a mask pattern may be used to cover the first transparent semiconductor pattern 181, so that the first transparent semiconductor pattern 181 is not affected by the modification process. The mask pattern may be a photoresist or other structure layer.

Figure 15:
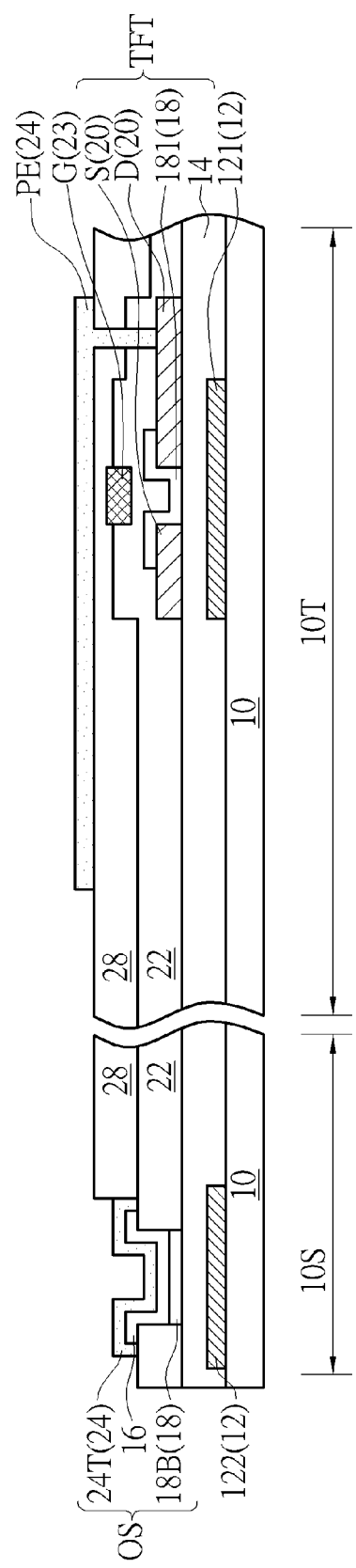

As shown in FIG. 15, later, the third insulating layer 28 is formed on the third patterned metal layer 23 and the second insulating layer 22. The third insulating layer 28 at least partially exposes the drain electrode D and the optical sensing pattern 16. Thereafter, the first patterned transparent conductive layer 24 is formed on the third insulating layer 28 and the optical sensing pattern 16. The first patterned transparent conductive layer 24 includes a transparent top electrode 24T, and the transparent top electrode 24T covers the optical sensing pattern 16. Based on the above-mentioned steps, the transferred transparent bottom electrode 18B, the optical sensing pattern 16 and the transparent top electrode 24T may form the optical sensor device OS.

In a variant embodiment, the step of forming the third insulating layer 28 may be previous to the step of forming the optical sensing pattern 16. That is to say that while forming the third insulating layer 28, the second transparent semiconductor pattern 182 is not covered with any other film. In this condition, the above-mentioned step of forming the third insulating layer 28 may include performing a deposition process, such as a chemical vapor deposition process, and the modification process may include introducing the gas simultaneously while performing the chemical vapor deposition process to transfer the second transparent semiconductor pattern 182 into the transparent bottom electrode 18B, wherein the introduced gas may include a mixture of silane gas, ammonia gas and nitrogen gas, but not limited thereto. In other words, the method of this embodiment may simultaneously perform the deposition process and the hydrogenation process to increase content of hydrogen in the second transparent semiconductor pattern 182 thereby transferring the semiconductor into the conductor, and the transferred second transparent semiconductor pattern 182 may serve as the transparent bottom electrode 18B. In a specific example, a flow ratio of ammonia gas to silane gas is substantially 6. For example, a flow of ammonia gas is 2160 sccm, a flow of silane gas is 360 sccm, and a flow of nitrogen gas is 2800 sccm, but not limited thereto. After the transparent bottom electrode 18B is formed, the optical sensing pattern 16 and the first patterned transparent conductive layer 24 are formed. The first patterned transparent conductive layer 24 includes the transparent top electrode 24T, and the transparent top electrode 24T covers the optical sensing pattern 16. According to the aforementioned steps, the transferred transparent bottom electrode 18B, the optical sensing pattern 16 and the transparent top electrode 24T may form the optical sensor device OS.

By the above-mentioned steps, the thin film transistor device TFT is fabricated in the switching device region 10T, and the optical sensor device OS is fabricated in the optical sensor device region 10S at the same time. In order to avoid the thin film transistor device TFT and the optical sensor device OS producing the photo-induced current, a size of the first pattern 121 is preferably larger than a size of the first transparent semiconductor pattern 181, and a size of the second pattern 122 is preferably larger than a size of the transparent bottom electrode 18B. In this embodiment, the thin film transistor device TFT may be electrically connected to the optical sensor device OS to be a driving device of the optical sensor device OS or be electrically connected to a pixel structure for displaying to be a driving device or switching device of the pixel structure. In addition, the thin film transistor device TFT of this embodiment is a top gate type thin film transistor device, but is not limited thereto. For example, the first pattern 121 disposed in the switching device region 10T may selectively serve as a bottom gate of the thin film transistor device TFT, and the gate electrode G of the third patterned metal layer 23 may serve as a top gate, thereby forming the dual gate thin film transistor device.

Figure 16:
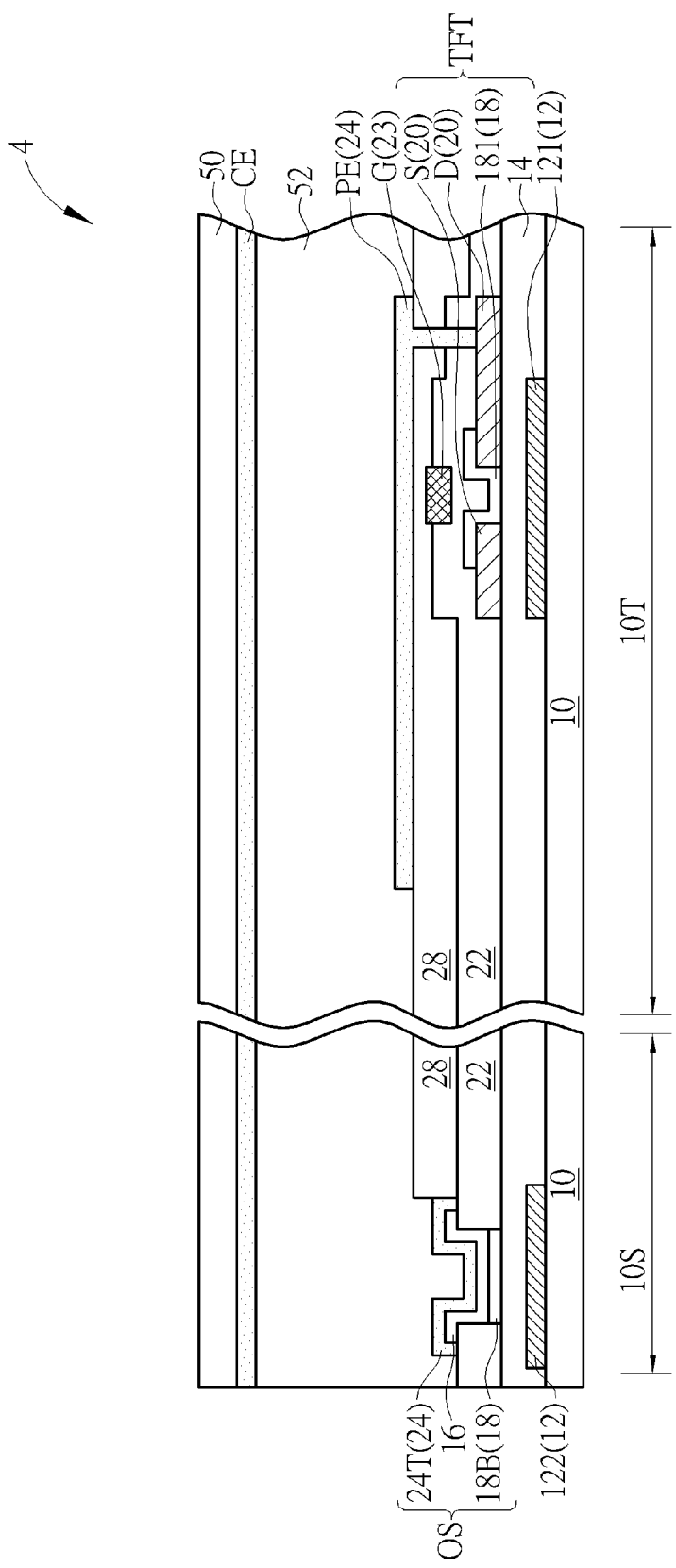

The method of fabricating the optical sensor device and the thin film transistor device of this embodiment may selectively further be integrated with a process of the pixel structure to be an application of the display panel with the optical sensor device. While being integrated with the pixel structure, the first patterned transparent conductive layer 24 may further include a pixel electrode PE connected to the drain electrode D. Please continue to refer to FIG. 16. As shown in FIG. 16, another substrate 50 is provided, and a common electrode CE is formed on the substrate 50. Next, the substrate 10 is combined with the substrate 50, and a display medium layer 52 is formed between the substrate 10 and the substrate 50 to from a display panel 4 of this embodiment. The display medium layer may include a liquid crystal layer or other suitable non-self-luminescent display medium layer or self-luminescent display medium layer. The display panel 4 of this embodiment may further be combined with a backlight module (not shown in figures) to achieve displaying function through light source provided by the backlight module. It is worthy to note that the first pattern 121 in the switching device region 10T not only may serve as the bottom gate of the double gate, but also may further shield the light to avoid the thin film transistor device TFT producing the leakage current. Also, the second pattern 122 in the optical sensor device region 10S that may be floating is not connected to other signal sources and may be used to shield the backlight to avoid the optical sensor device OS producing the leakage current. Or, the display panel 4 also may use the ambient light as the light source to achieve the displaying function. Otherwise, the optical sensor device OS may provide a touch input function or a fingerprint identification function. In other words, a finger of the user or an input device may shield the ambient light to change the intensity of the light received by the optical sensor device OS while performing touch inputting at an input position or fingerprint identifying, such that the input position or the fingerprint may be determined. Or, the user may use the input device with active emitting function, such that the optical sensing device OS may receive different lights at the input position, thereby determining whether the input enter or not.

Figure 17:
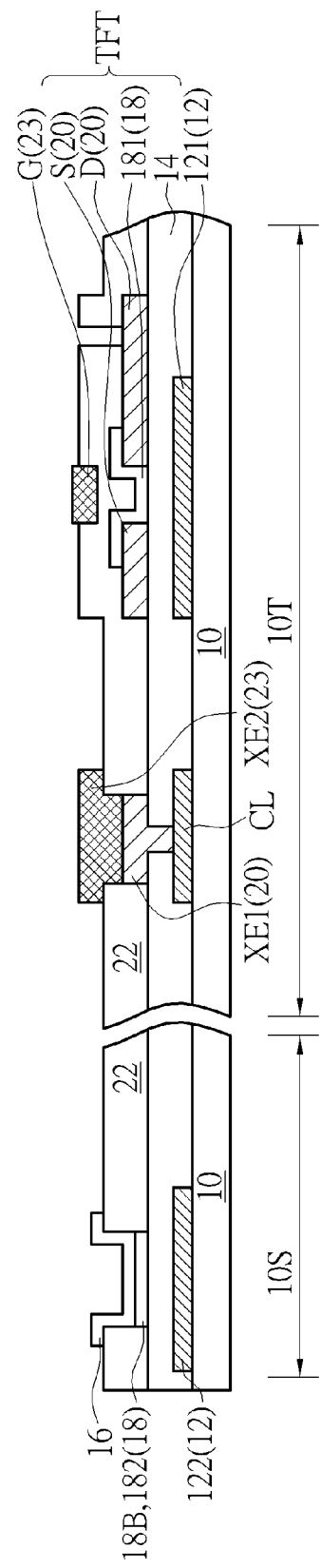
FIGS. 17 and 18 are schematic diagrams illustrating a method of fabricating an optical sensor device and a thin film transistor device according to a fifth embodiment of the present invention.
Figure 18:
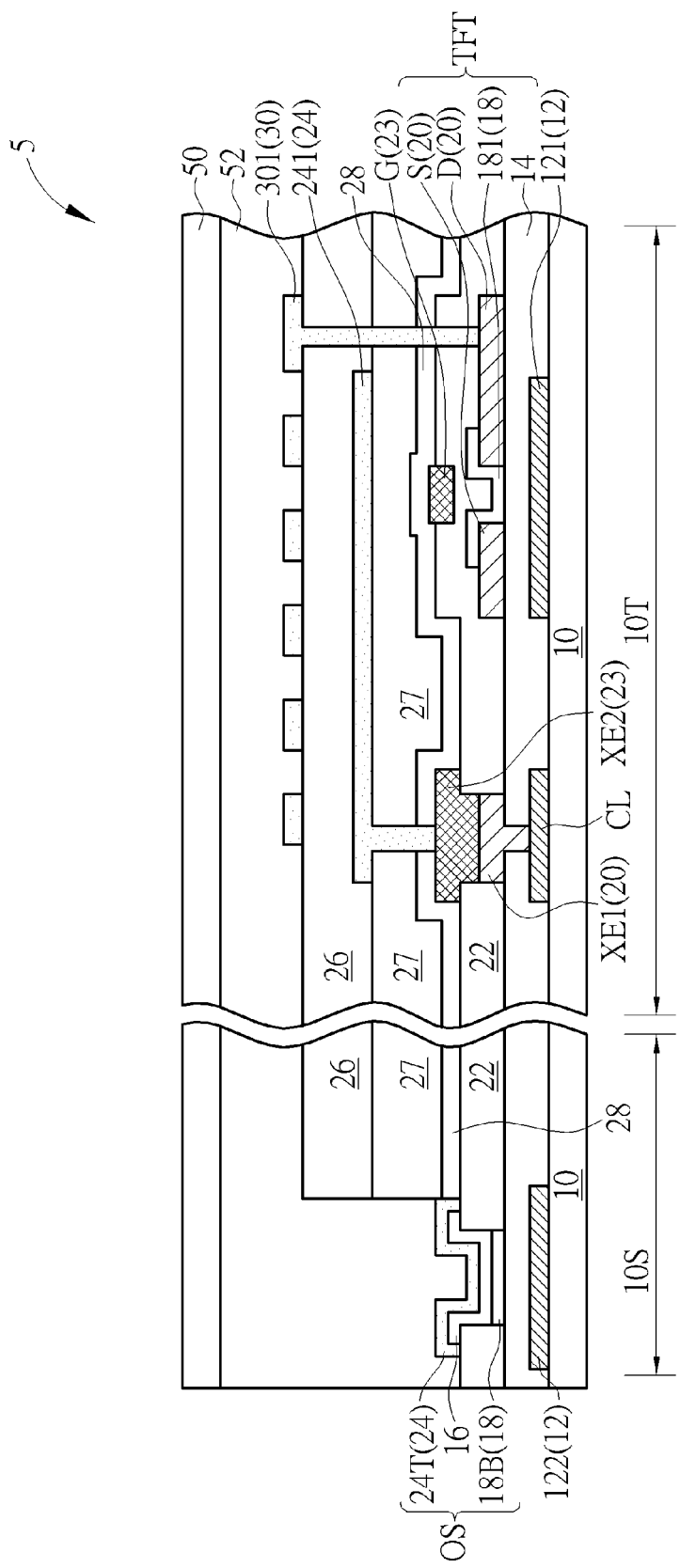

Please refer to FIGS. 17 and 18. FIGS. 17 and 18 are schematic diagrams illustrating a method of fabricating an optical sensor device and a thin film transistor device according to a fifth embodiment of the present invention. As shown in FIG. 17, the substrate 10 is provided first, and then, the first patterned metal layer 12 is formed on the substrate 10. The first patterned metal layer 12 of this embodiment not only includes the first pattern 121 disposed in the switching device region 10T, and the second pattern 122 disposed in the optical sensor device region 10S, but also may selectively include a common line CL disposed in the switching device region 10T. Next, the first insulating layer 14 is formed on the substrate 10 and the first patterned metal layer 12, wherein the first insulating layer 14 at least partially exposes the common line CL. Subsequently, the second patterned metal layer 20 is formed on the first insulating layer 14. In addition to including the source electrode S and the drain electrode D in the switching device region 10T, the second patterned metal layer 20 further may selectively include a first connection electrode XE1 connected to the common line CL exposed by the first insulating layer 14. Thereafter, the patterned transparent semiconductor layer 18 is formed on the first insulating layer 14. The patterned transparent semiconductor layer 18 includes a first transparent semiconductor pattern 181 disposed in the switching device region 10T and partially covering the source electrode S and the drain electrode D, and the second transparent semiconductor pattern 182 disposed in the optical sensor device region 10S. Next, the second insulating layer 22 is formed on the first insulating layer 14. The second insulating layer 22 covers the second patterned metal layer 20 and the first transparent semiconductor pattern 181 and at least partially exposes the second transparent semiconductor pattern 182, the first connection electrode XE1 and a part of drain electrode D. Then, the optical sensing pattern 16 is formed on the second insulating layer 22 in the optical sensor device region 10S. The optical sensing pattern 16 covers the second transparent semiconductor pattern 182. Furthermore, the third patterned metal layer 23 is formed on the second insulating layer 22. In addition to including the gate electrode G disposed on the first transparent semiconductor pattern 181, the third patterned metal layer 23 further may selectively include a second connection electrode XE2 connected to the first connection electrode XE1 exposed by the second insulating layer 22.

The method of this embodiment may further include performing a modification process including introducing at least one gas to transfer the second transparent semiconductor pattern 182 into the transparent bottom electrode 18B with electrical conductibility that serves as the bottom electrode of the optical sensor device. The modification process may be performed at any time after the second transparent semiconductor pattern 182 is formed. For example, the modification process of this embodiment may be a hydrogenation process that may hydrogenate the second transparent semiconductor pattern 182 thereby transferring the second transparent semiconductor pattern 182 from the semiconductor into the transparent bottom electrode 18B with electrical conductibility. The modification process may include an anneal process, and composition of the introduced gas includes hydrogen. For example, introducing the gas may be introducing vapor or clean dry air. That is, the modification process may include a H$_2$O anneal process or a clean dry air anneal (CDA anneal) process, where the clean dry air includes, but not limited to, 25% of oxygen or other gas containing hydrogen. It is worthy to note that the modification process of this embodiment may further be integrated with the step of forming the optical sensing pattern 16, which means if the aforementioned gas is introduced in the step of forming the optical sensing pattern 16, the second transparent semiconductor pattern 182 may be transferred from the semiconductor into the transparent bottom electrode 18B in the step of forming the optical pattern 16, thereby simplifying the process and saving the manufacturing cost. In a variant embodiment, the modification process may include a plasma process, and the introduced gas may include hydrogen (that is hydrogen plasma process) or other gas containing hydrogen. In another embodiment, when the second transparent semiconductor pattern 182 is formed of silicon or other semiconductor materials, the modification process may also be an ion implantation process which implants dopants such as P-type dopants or N-type dopants into the second transparent semiconductor pattern 182, so that the second transparent semiconductor pattern 182 may be transferred from the semiconductor into the transparent bottom electrode 18B with electrical conductibility, or other suitable modification process.

As shown in FIG. 18, next, the third insulating layer 28 is formed on the third patterned metal layer 23 and the second insulating layer 22. The third insulating layer 28 exposes the optical sensing pattern 16, and at least partially exposes the drain electrode D and at least partially exposes the second connection electrode X2. Then, the first patterned transparent conductive layer 24 is formed on the third insulating layer 28. The first patterned transparent conductive layer 24 includes the transparent top electrode 24T covering the optical sensing pattern 16, and the transferred transparent bottom electrode 18B, the optical sensing pattern 16 and the transparent top electrode 24T may form the optical sensor device OS. The first patterned transparent conductive layer 24 may further include a first electrode 241. It is worthy to note that the method of this embodiment may selectively include forming a fifth insulating layer 27 on the second insulating layer 22 before forming the first patterned transparent conductive layer 24. The fifth insulating layer 27 at least partially exposes the optical sensing pattern 16, the second connection electrode XE2 and the drain electrode D. The fifth insulating layer 27 may include an inorganic insulating layer, such as silicon oxide layer, silicon nitride layer, silicon oxynitride layer, but not limited thereto, or an organic insulating layer. Thereafter, the fourth insulating layer 26 and the second patterned transparent conductive layer 30 are sequentially formed on the first patterned transparent conductive layer 24. The fourth insulating layer 26 at least partially exposes the transparent top electrode 24T and the drain electrode D, and the second patterned transparent conductive layer 30 includes a second electrode 301. The fourth insulating layer 26 may include an inorganic insulating layer, such as silicon oxide layer, silicon nitride layer, silicon oxynitride layer, but not limited thereto, or an organic insulating layer. One of the first electrode 241 and the second electrode 301 is connected to the drain electrode D, and the other one of the first electrode 241 and the second electrode 301 is connected to the second connection electrode XE2. For example, in this embodiment, the first electrode 241 is a common electrode connected to the second connection electrode XE2, thereby receiving the common voltage through the first connection electrode XE1 and the common line CL, and the second electrode 301 is a pixel electrode connected to the drain electrode D, thereby receiving the pixel voltage, but not limited thereto. In addition, the first electrode 241 is a full-surfaced electrode. The second electrode 301 that is a patterned electrode may include for example a plurality of branch electrodes, and a slit exists between the adjacent branch electrodes, but not limited thereto. Later, the substrate 10 is combined with the other one substrate 50, and the display medium layer 52 is then formed between the substrate 10 and the substrate 50 to form the display panel 5 of this embodiment.

In this embodiment, the above-mentioned step of forming the second insulating layer 22, the third insulating layer 28, the fourth insulating layer 26 or the fifth insulating layer 27 may include performing a deposition process, such as chemical vapor deposition process, and the modification process may include introducing the gas simultaneously while performing the chemical vapor deposition process to transfer the second transparent semiconductor pattern 182 into the transparent bottom electrode 18B, wherein the introduced gas may include a mixture of silane gas, ammonia gas and nitrogen gas, but not limited thereto. In other words, the method of this embodiment may simultaneously perform the deposition process and the hydrogenation process to increase content of hydrogen in the second transparent semiconductor pattern 182 thereby transferring the semiconductor into the conductor, and the transferred second transparent semiconductor pattern 182 may serve as the transparent bottom electrode 18B. In a specific example, a flow ratio of ammonia gas to silane gas is substantially 6. For example, a flow of ammonia gas is 2160 sccm, a flow of silane gas is 360 sccm, and a flow of nitrogen gas is 2800 sccm, but not limited thereto. It is worth noting that if the modification process is performed right after the second transparent semiconductor pattern 182 is formed, the transparent bottom electrode may be damaged while performing patterning process on any one of the second insulating layer 22, the third patterned metal layer 23, the fifth insulating layer 27, the fourth insulating layer 26 and the first patterned transparent conductive layer 24. Accordingly, when the modification process is integrated with the process of forming the fourth insulating layer 26, not only no extra process step is increased, but also the damage of the transparent bottom electrode 18B generated in the above patterning process may be repaired to make sure of the transparent bottom electrode 18B having good conductivity.

Figure 19:
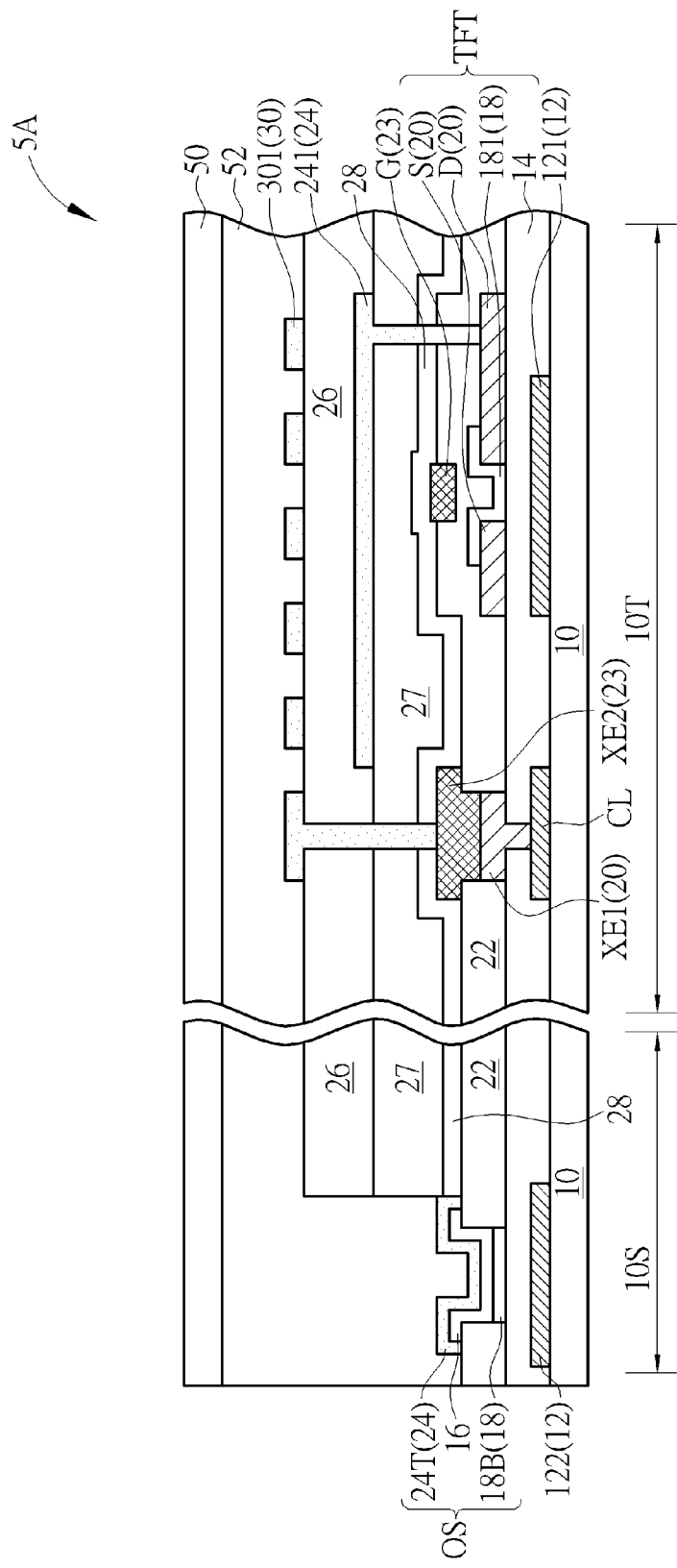
FIG. 19 is schematic diagram illustrating a method of fabricating an optical sensor device and a thin film transistor device according to a variant embodiment of the fifth embodiment of the present invention.

Please refer to FIG. 19. FIG. 19 is schematic diagram illustrating a method of fabricating an optical sensor device and a thin film transistor device according to a variant embodiment of the fifth embodiment of the present invention. As shown in FIG. 19, different from the fifth embodiment, in the display panel 5A of this variant embodiment, the first electrode 241 of the first patterned transparent conductive layer 24 is a pixel electrode connected to the drain electrode D, and the second electrode 301 of the second patterned transparent conductive layer 30 is a common electrode connected to the second connection electrode XE2.

Figure 20:
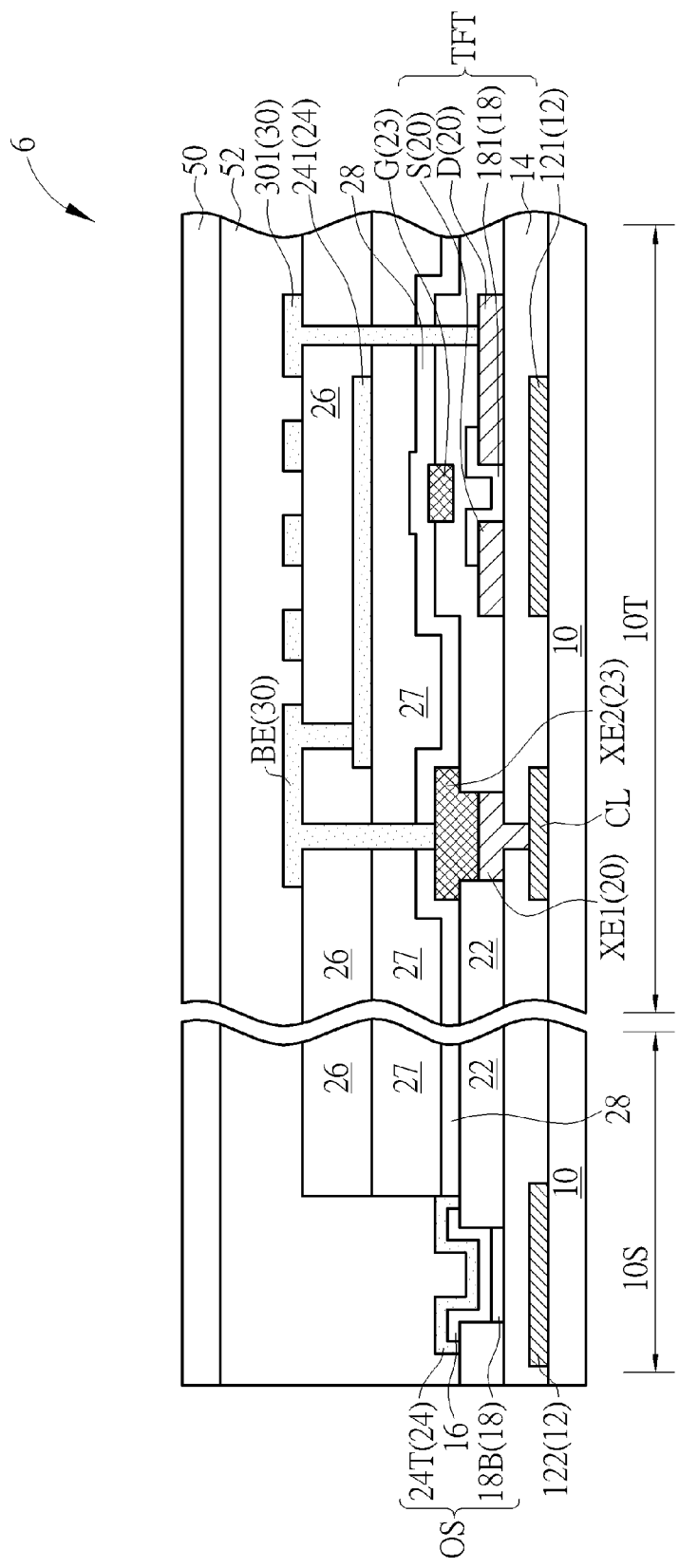
FIG. 20 is a schematic diagram illustrating a method of fabricating an optical sensor device and a thin film transistor device according to a sixth embodiment of the present invention.

Please refer to FIG. 20. FIG. 20 is a schematic diagram illustrating a method of fabricating an optical sensor device and a thin film transistor device according to a sixth embodiment of the present invention. As shown in FIG. 20, the difference between the sixth embodiment and the fifth embodiment is that the second patterned transparent conductive layer 30 of the sixth embodiment further includes a bridge electrode BE connected to the first electrode 241 serving as the common electrode and the second connection electrode XE2 respectively. In other words, the first electrode 241 is not directly connected to the connection electrode XE, but is connected to the second connection electrode XE2 through the bridge electrode BE thereby receiving the common voltage. By the above-mentioned method, the display panel 6 of this embodiment may be fabricated.

As the mentioned above, the present invention provides an integration method of fabricating an optical sensor device and a thin film transistor device, which uses the same patterned transparent semiconductor layer as the top electrode or the bottom electrode of the optical sensor device and the channel layer of the thin film transistor device, and utilizes the modification process to transfer the transparent semiconductor pattern of the optical sensor device into the top electrode or the bottom electrode. Thus, not only the process may be effectively simplified, but also the electrode of the optical sensor device may be guaranteed from the damage in the process, thereby increasing the reliability and yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an optical sensor device and a thin film transistor device, comprising:
    providing a substrate, the substrate having a switching device region and an optical sensor device region;
    forming a first patterned metal layer on the substrate, wherein the first patterned metal layer comprises a common line, a gate electrode disposed in the switching device region, and a bottom electrode disposed in the optical sensor device region;
    forming a first insulating layer on the first patterned metal layer, the first insulating layer covering the gate electrode, and the first insulating layer at least partially exposing the bottom electrode;
    forming an optical sensing pattern on the bottom electrode;
    forming a patterned transparent semiconductor layer on the first insulating layer, wherein the patterned transparent semiconductor layer comprises a first transparent semiconductor pattern covering the gate electrode, and a second transparent semiconductor pattern covering the optical sensing pattern;
    forming a second patterned metal layer on the patterned transparent semiconductor layer, wherein the second patterned metal layer comprises a connection electrode connected to the common line, and a source electrode and a drain electrode partially covering the first transparent semiconductor pattern respectively, and the second patterned metal layer at least partially exposes the second transparent semiconductor pattern; and
    performing a modification process on the second transparent semiconductor pattern, the modification process comprising introducing at least one gas to transfer the second transparent semiconductor pattern into a transparent top electrode with electrical conductibility; and
    forming a second insulating layer and a first patterned transparent conductive layer sequentially on the second patterned metal layer, wherein the second insulating layer and the first patterned transparent conductive layer at least partially exposes the transparent top electrode; and
    forming a third insulating layer and a second patterned transparent conductive layer sequentially on the first patterned transparent conductive layer, wherein the third insulating layer and the second patterned transparent conductive layer expose the transparent top electrode, the first patterned transparent conductive layer comprises a first electrode, the second patterned transparent conductive layer comprises a second electrode, one of the first electrode and the second electrode is connected to the drain electrode, and the other one of the first electrode and the second electrode is connected to the connection electrode.

2. The method of fabricating the optical sensor device and the thin film transistor device according to claim 1, wherein the second insulating layer at least partially exposes the drain electrode, the first patterned transparent conductive layer comprises a pixel electrode, and the pixel electrode is connected to the drain electrode.

3. The method of fabricating the optical sensor device and the thin film transistor device according to claim 1, wherein the second electrode is a pixel electrode connected to the drain electrode, and the first electrode is a common electrode connected to the connection electrode.

4. The method of fabricating the optical sensor device and the thin film transistor device according to claim 3, wherein the second patterned transparent conductive layer further comprises a bridge electrode, and the first electrode and the connection electrode are connected to each other through the bridge electrode.

5. The method of fabricating the optical sensor device and the thin film transistor device according to claim 1, wherein the second electrode is a common electrode connected to the connection electrode, and the first electrode is a pixel electrode connected to the drain electrode.

6. The method of fabricating the optical sensor device and the thin film transistor device according to claim 1, wherein the step of forming the second insulating layer or the step of forming the third insulating layer includes performing a chemical vapor deposition process, and the modification process comprises introducing the at least one gas while performing the chemical vapor deposition process to transfer the second transparent semiconductor pattern into the transparent top electrode.

7. The method of fabricating the optical sensor device and the thin film transistor device according to claim 6, wherein the at least one gas comprises a mixture of silane gas, ammonia gas and nitrogen gas.

8. The method of fabricating the optical sensor device and the thin film transistor device according to claim 1, further comprising forming a fourth insulating layer on the second insulating layer before forming the first patterned transparent conductive layer, wherein the fourth insulating layer at least partially exposes the bottom electrode and the drain electrode.

9. The method of fabricating the optical sensor device and the thin film transistor device according to claim 1, further comprising forming an etching stop layer on the first insulating layer and the patterned transparent semiconductor layer before forming the second patterned metal layer, wherein the etching stop layer exposes the second transparent semiconductor pattern and partially exposes the first transparent semiconductor pattern, and the source electrode and the drain electrode are connected to the first transparent semiconductor pattern exposed by the etching stop layer.

10. The method of fabricating the optical sensor device and the thin film transistor device according to claim 1, wherein the modification process comprises an anneal process, and the at least one gas comprises hydrogen.

11. The method of fabricating the optical sensor device and the thin film transistor device according to claim 10, wherein the at least one gas comprises vapor or clean dry air.

12. The method of fabricating the optical sensor device and the thin film transistor device according to claim 1, wherein the modification process comprises a plasma process, and the at least one gas comprises hydrogen.

13. A method of fabricating an optical sensor device and a thin film transistor device, comprising:
providing a substrate, the substrate having a switching device region and an optical sensor device region;
forming a first patterned metal layer on the substrate, wherein the first patterned metal layer comprises a first pattern disposed in the switching device region, and a second pattern disposed in the optical sensor device region;
forming a first insulating layer on the first patterned metal layer, the first insulating layer covering the first pattern and the second pattern;
forming a second patterned metal layer on the first insulating layer, wherein the second patterned metal layer comprises a source electrode and a drain electrode, and the source electrode and the drain electrode are disposed on the first pattern in the switching device region;
forming a patterned transparent semiconductor layer on the first insulating layer, wherein the patterned transparent semiconductor layer comprises a first transparent semiconductor pattern partially covering the source electrode and the drain electrode, and a second transparent semiconductor pattern disposed in the optical sensor device region;
forming a second insulating layer on the first insulating layer, wherein the second insulating layer covers the first transparent semiconductor pattern and at least partially exposes the second transparent semiconductor pattern;
forming an optical sensing pattern on the second insulating layer in the optical sensor device region, wherein the optical sensing pattern covers the second transparent semiconductor pattern;
forming a third patterned metal layer on the second insulating layer, wherein the third patterned metal layer comprises a gate electrode, the gate electrode is disposed on the first transparent semiconductor pattern, and the third patterned metal layer at least partially exposes the second transparent semiconductor pattern;
forming a third insulating layer on the third patterned metal layer, wherein the third insulating layer at least partially exposes the drain electrode;
forming a first patterned transparent conductive layer on the third insulating layer, wherein the first patterned transparent conductive layer comprises a transparent top electrode, and the transparent top electrode covers the optical sensing pattern; and
performing a modification process on the second transparent semiconductor pattern, the modification process comprising introducing at least one gas to transfer the second transparent semiconductor pattern into a transparent bottom electrode with electrical conductibility.

14. The method of fabricating the optical sensor device and the thin film transistor device according to claim 13, wherein the first patterned transparent conductive layer further comprises a pixel electrode connected to the drain electrode.

15. The method of fabricating the optical sensor device and the thin film transistor device according to claim 13, further comprising forming a fourth insulating layer and a second patterned transparent conductive layer sequentially on the first patterned transparent conductive layer, wherein the fourth insulating layer at least partially exposes the transparent top electrode, the first patterned transparent conductive layer comprises a first electrode, the second patterned transparent conductive layer comprises a second electrode, and one of the first electrode and the second electrode is connected to the drain electrode.

16. The method of fabricating the optical sensor device and the thin film transistor device according to claim 15, wherein the first patterned metal layer further comprises a common line, the second patterned metal layer further comprises a first connection electrode connected to the common line, and the third patterned metal layer further comprises a second connection electrode connected to the first connection electrode.

17. The method of fabricating the optical sensor device and the thin film transistor device according to claim 16, wherein the other one of the first electrode and the second electrode is connected to the second connection electrode.

18. The method of fabricating the optical sensor device and the thin film transistor device according to claim 17, wherein the second electrode is a pixel electrode connected to the drain electrode, the first electrode is a common electrode connected to the second connection electrode.

19. The method of fabricating the optical sensor device and the thin film transistor device according to claim 18, wherein the second patterned transparent conductive layer further comprises a bridge electrode, the first electrode and the second connection electrode are connected to each other through the bridge electrode.

20. The method of fabricating the optical sensor device and the thin film transistor device according to claim 17, wherein the second electrode is a common electrode connected to the second connection electrode, the first electrode is a pixel electrode connected to the drain electrode.

21. The method of fabricating the optical sensor device and the thin film transistor device according to claim 15, wherein the modification process comprises introducing the at least one gas while forming the optical sensing pattern to transfer the second transparent semiconductor pattern into the transparent bottom electrode.

22. The method of fabricating the optical sensor device and the thin film transistor device according to claim 15, further comprising forming a fifth insulating layer on the third insulating layer before forming the first patterned transparent conductive layer, wherein the fifth insulating layer at least partially exposes the transparent bottom electrode and the drain electrode.

23. The method of fabricating the optical sensor device and the thin film transistor device according to claim 13, wherein the modification process comprises an anneal process, and the at least one gas comprises hydrogen.

24. The method of fabricating the optical sensor device and the thin film transistor device according to claim 23, wherein the at least one gas comprises vapor or clean dry air.

25. The method of fabricating the optical sensor device and the thin film transistor device according to claim 13, wherein the modification process comprises a plasma process, and the at least one gas comprises hydrogen.

26. The method of fabricating the optical sensor device and the thin film transistor device according to claim 13, wherein the second pattern is floating, and a size of the second pattern is larger than a size of the transparent bottom electrode.

* * * * *